United States Patent
Verhaege et al.

(10) Patent No.: US 6,529,359 B1
(45) Date of Patent: Mar. 4, 2003

(54) CIRCUITS FOR DYNAMIC TURN OFF OF NMOS OUTPUT DRIVERS DURING EOS/ESD STRESS

(75) Inventors: Koen Gerard Maria Verhaege, Gistel (BE); Leslie Ronald Avery, Flemington, NJ (US)

(73) Assignee: Sarnoff Corporation, Princeton, NJ (US)

( * ) Notice: Subject to any disclaimer, the term of this patent is extended or adjusted under 35 U.S.C. 154(b) by 199 days.

(21) Appl. No.: 09/632,226

(22) Filed: Aug. 4, 2000

Related U.S. Application Data
(60) Provisional application No. 60/148,098, filed on Aug. 6, 1999.

(51) Int. Cl.$^7$ ............................................. H02H 3/00
(52) U.S. Cl. ...................................................... 361/100
(58) Field of Search ........................... 361/56–59, 91.6, 361/100, 111; 323/270; 363/50; 357/23.13, 355–357

(56) References Cited

U.S. PATENT DOCUMENTS

| | | | | |
|---|---|---|---|---|
| 5,345,357 A | * | 9/1994 | Pianka ........................... | 361/91 |
| 5,508,649 A | * | 4/1996 | Shay ............................. | 361/56 |
| 5,561,577 A | * | 10/1996 | Motley ......................... | 361/111 |
| 5,617,283 A | | 4/1997 | Krakauer et al. ............. | 361/56 |
| 5,708,549 A | * | 1/1998 | Croft .............................. | 361/111 |
| 5,729,419 A | | 3/1998 | Lien ............................... | 361/111 |
| 5,754,381 A | * | 5/1998 | Ker ................................ | 361/56 |
| 5,838,146 A | * | 11/1998 | Singer ............................ | 361/91 |
| 5,852,541 A | * | 12/1998 | Lin et al. ....................... | 361/111 |
| 5,901,022 A | * | 5/1999 | Ker ................................ | 361/56 |
| 5,917,689 A | | 6/1999 | English et al. ................. | 361/56 |
| 6,028,450 A | * | 2/2000 | Nance ............................ | 326/81 |
| 6,091,594 A | * | 7/2000 | Williamson et al. .......... | 361/111 |
| 6,157,530 A | * | 12/2000 | Pequignot et al. ............. | 361/111 |

FOREIGN PATENT DOCUMENTS

| | | | | |
|---|---|---|---|---|
| EP | 0 575 062 A1 | 12/1993 | ............. | H01L/27/02 |
| GB | 2 305 035 A | 3/1997 | ............. | H03K/19/003 |

* cited by examiner

*Primary Examiner*—Edward H. Tso
*Assistant Examiner*—Pia Tibbits
(74) *Attorney, Agent, or Firm*—W. Burke

(57) ABSTRACT

A circuit for the protection of an output driver NMOS transistor during EOS/ESD stress includes an output driver NMOS transistor and an output driver PMOS transistor connected in series between a Vss line and a Vdd line with the gates of the output driver transistors being connected together. An I/O pad is connected to the junction of the output driver transistors. A pre-driver NMOS transistor and a pre-driver PMOS transistor are connected in series between the Vss line and the Vdd line with the gates of the out-put driver transistors being connected together with the output of the pre-driver transistors being connected to the gates of the output driver transistors. A gate clamp is connected between the Vss line, the I/O pad the junction between the pre-driver transistors and the gate of the output driver NMOS transistor. An ESD clamp is connected between the I/O pad, the Vss line and the gate clamp. The gate clamp may comprise a trigger circuit and an inverter circuit with the trigger circuit being either a capacitor and a resistor, or a resistor, MOS transistor and a Zener diode. The circuit may include a plurality of stages of pre-driver transistors.

18 Claims, 2 Drawing Sheets

CIRCUITS FOR DYNAMIC TURN OFF OF NMOS OUTPUT DRIVERS DURING EOS/ESD STRESS

This application claims the benefits of U.S. Provisional Application Serial No. 60/148,098, filed Aug. 6, 1999.

FIELD OF THE INVENTION

The present invention relates to circuits for the protection of a MOS output drive from electrical overstress (EOS) or electrostatic discharge (ES) stress, and, more particularly, to circuits for the dynamic turn off of an NMOS output driver during EOS/ESD stress.

BACKGROUND OF THE INVENTION

An NMOS output driver is subject to being damaged when subjected to EOS/ESD stress. Heretofore, for EOS/ESD protection of an I/O pad, either the NMOS output drivers was designed to be self-protecting, or an electrical EOS/ESD clamp was added in parallel to the NMOS output driver. For various reasons the use of an electrical EOS/ESD clamp is preferred for this purpose. However, when an electrical EOS/ESD clamp is added, a problem can arise when the EOS or ESD stress is applied to the I/O pad. There are several stress situations where as a result of the application of a transient over voltage stress at the I/O pad, the circuit or part of the circuit gets powered up dynamically. In such situations, the pre-drive circuits will force either a high or low state at the gate of the final output drivers which is undesirable.

SUMMARY OF THE INVENTION

A circuit for the protection of an output driver NMOS transistor during EOS/ESD stress includes an output driver NMOS transistor and an output driver PMOS transistor connected in series between a Vdd line and a Vss line with the gates of the output driver transistors being connected together. An I/O pad is connected to the junction between the output driver transistors. A pre-driver stage includes an NMOS transistor and a PMOS transistor connected in series between the Vss line and the Vdd line with the gates of the pre-driver transistors being connected together. The output of the pro driver stage is connected to the gates of the output driver transistors. A gate clamp has a first connection to the Vss line, a second connection to the junction between the pre-driver transistors, a third connection to the I/O pad and a fourth connection to the gate of the output driver NMOS transistor. An ESD clamp is connected between the I/O pad and the Vss line and has a connection to the third connection of the gate clamp.

DETAILED DESCRIPTION OF PREFERRED EMBODIMENTS

Figure 1:
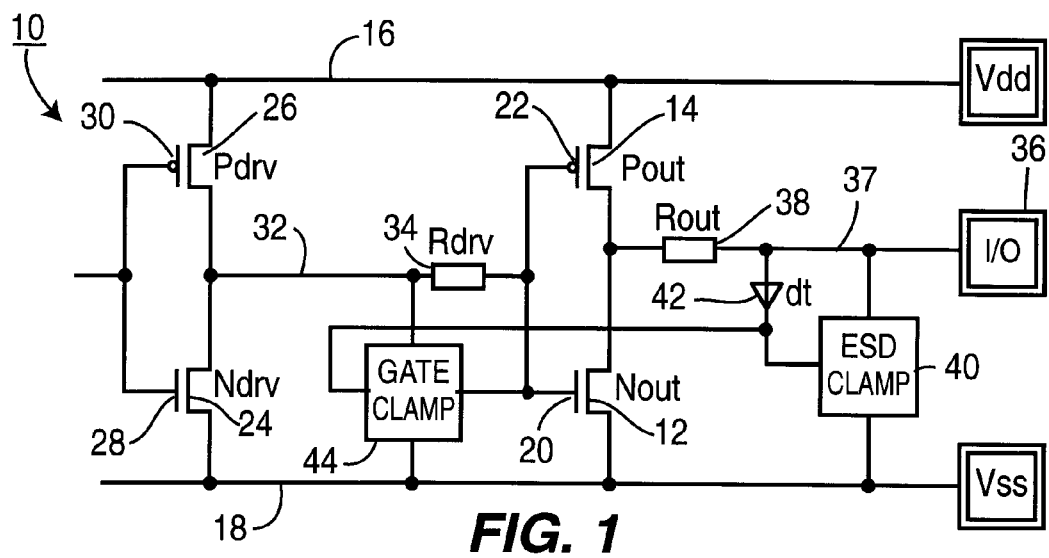
FIG. 1 is a schematic circuit diagram of a circuit of the present invention.

Referring initially to FIG. 1, the circuit of the present invention is generally designated as 10. Circuit 10 comprises an output driver NMOS transistor 12 and an output driver PMOS transistor 14 in series between a Vdd line 16 and a Vss line 18. The NMOS transistor 12 is the output driver which is to be protected. The gate 20 of the output driver NMOS transistor 12 is electrically connected to the gate 22 of the output driver PMOS transistor 14. A pre-driver NMOS transistor 24 and a pre-driver PMOS transistor 26 are electrically connected in series between the Vdd line 16 and the Vss line 18. The gate 28 of the preriver NMOS transistor 24 is electrically connected to the gate 30 of the pre-driver PMOS transistor 26. The gates 20 and 22 of the output driver NMOS transistor 12 and the output driver PMOS transistor 14 are electrically connected to the junction between the pre-driver NMOS transistor 24 and the pre-driver PMOS transistor 26 through a line 32 and through a resistor 34.

An I/O pad 36 is electrically connected to the junction between the output driver NMOS transistor 12 and the output driver PMOS transistor 14 by a line 37 and through an output resistor 38. An ESD clamp 40 is electrically connected between the line 37 and the Vss line 18. A dynamic trigger device 42 is connected between the line 37 and the ESD clamp 40. A gate clamp 44 is electrically connected between the line 32 and the Vss line 18. The gate clamp 44 is also connected to the gate 20 of the output driver NMOS transistor 20 and to the ESD clamp 40.

In the circuit 10, the CMOS output driver circuit (the output driver NMOS transistor 12 and the output driver PMOS transistor 14) is driven by the pre-driver transistors 24 and 26. The dynamic trigger device 42 is used to trigger the ESD clamp 40. The output resistor 38 is a decoupling resistor between the output drivers and the protection circuit (ESD clamp 40) and is optional in the circuit. The gate clamp 44 grounds the gate 20 of the output driver NMOS transistor 12 under transient over voltage stress conditions. In the circuit 10, the output driver NMOS transistor 12 is turned OFF during EOS/ESD stress, independent of the pre-driver state (high or low). As such, the ESD stress can be diverted to the parallel ESD clamp and the EOS/ESD capability is achieved. Although the clamp 40 is referred to as an ESD clamp, it will also serve as an EOS clamp.

Figure 2:
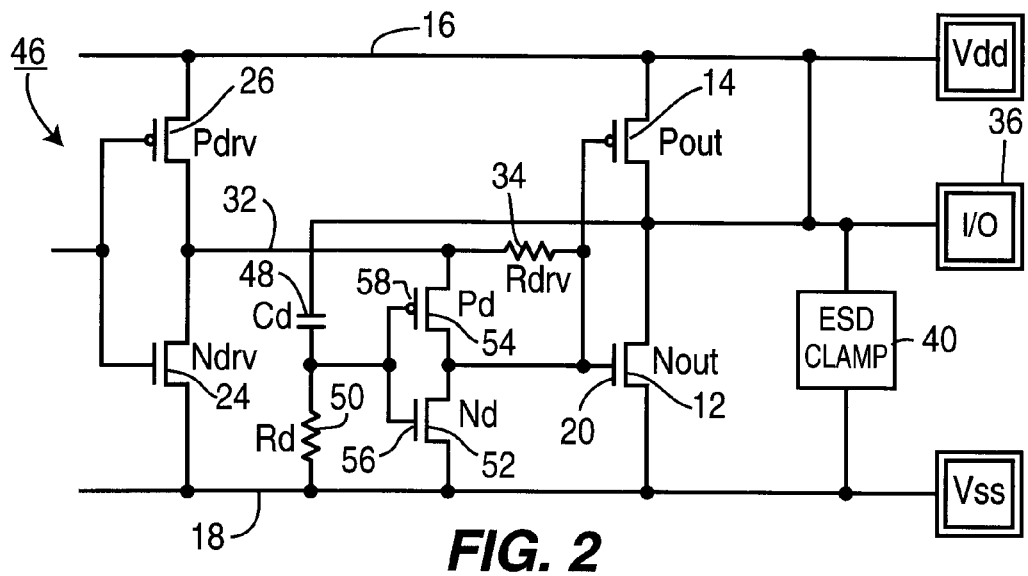
FIG. 2 is a circuit diagram of one version of the circuit of the present invention shown in FIG. 1.

Referring to FIG. 2, another form of the protection circuit of the present invention is generally designated as 46. Protection circuit 46 is structurally the same as the circuit 10 shown in FIG. 1 except for the "replacement" of the diode 42 and the form of the gate clamp. In the protection circuit 46, the trigger device comprises a capacitor 48 in series with a resistor 50. This RC circuit is connected between the Vss line 18 and the junction between the output driver NMOS transistor 12 and the output driver PMOS transistor 14. The gate clamp comprises an inverter formed of transistor 52 and a PMOS transistor 54. The output of the RC circuit is connected to the inverter. The NMOS transistor 52 and the PMOS transistor 54 of the inverter are in series between the Vss line 18 and the line 32 connecting the output of the pre-drive transistors to the gates of the output drive transistors. The gates 56 and 58 of the inverter transistors 52 and 54 are connected to the junction between the capacitor 48 and the resistor 50 of the RC circuit. The output of the inverter is connected to the gate 20 of the output driver NMOS transistor 12.

The circuit 46 shown in FIG. 2 operates in the same manner as the circuit 10 shown in FIG. 1. However, in the circuit 46, the RC circuit is used to drive the inverter, the NMOS transistor 52 and the PMOS transistor 54. This inverter is powered by the output of the pre-driver circuit, pre-driver NMOS transistor 24 and pre-driver PMOS transistor 26. The output of the inverter is connected to the gate of the output NMOS transistor 12. The time constant of the RC circuit is chosen small enough that under normal operating conditions the NMOS transistor 52 is OFF and the PMOS transistor 54 is ON so that the inverter does not disturb the normal operation of the pre-driver and output driver circuit. Under normal operating conditions, the ON-state of PMOS transistor 54 will reduce the ballast resistance due to resistor 34. The time constant of the RC circuit is also chosen large enough that under EOS/ESD conditions the inverter will drive the inverter PMOS transistor 54 OFF and the inverter NMOS transistor 52 ON to effectively ground the gate of the output NMOS transistor 12. A voltage division between the resistor 34 and the open inverter NMOS transistor 52 can be chosen to keep the gate voltage of the output NMOS transistor 12 below its threshold voltage. Because of the presence of the resistor 34, the size of the inverter NMOS transistor 52 can be smaller than in the case when the drive resistor would be omitted.

Figure 3:
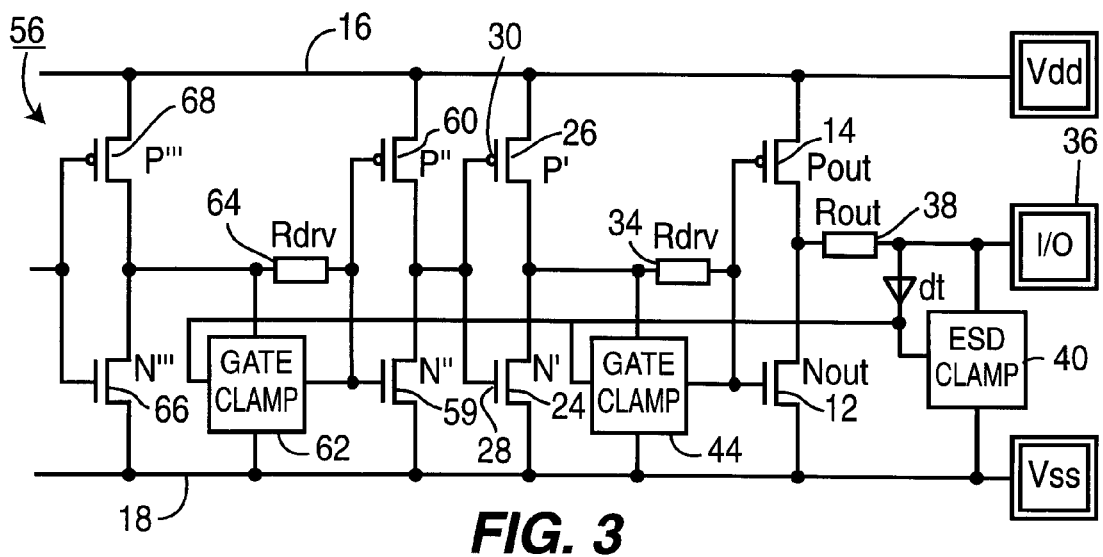
FIG. 3 is a circuit diagram of another version of the circuit of the present invention.

Referring to FIG. 3, there is shown a third form of the circuit of the present invention, generally designated as 56, which, as an alternative or as a complement, provides additional pre-driver stages for driving the final output NMOS transistor 12 open or closed. As shown in FIG. 3, the circuit 56 in addition to the first pre-driver NMOS transistor 24 and first pre-driver PMOS transistor 26 includes a second pre-driver NMOS transistor 59 and a second pre-driver PMOS transistor 60 connected in series between the Vdd line 16 and the Vss line 18. The gates 28 and 30 of the first pre-driver NMOS transistor 24 and the first pre-driver PMOS transistor 26 are connected to the junction between the second pre-driver NMOS transistor 59 and the second pre-driver PMOS transistor 60. A second gate clamp 62 and second drive resistor 64 are connected to the second pre-driver transistors 59 and 60 in a manner similar to the manner that the gate clamp 44 and resistor 34 are connected to the output transistors 12 and 14. A third pre-driver NMOS transistor 66 and a third pre-driver PMOS transistor 68 are connected in series between the Vdd line 16 and the Vss line 18. The junction between the third pre-driver transistors 66 and 68 is connected to the gates of the second pre-driver transistors 59 and 60 through the second resistor 64.

The circuit 56 shown in FIG. 3 allows the use of smaller sizes for the gate clamp and the earlier pre-driver circuit will be dimensioned much small also. If the output driver is counted as the first driver circuit, then the second gate clamp must be connected to the gate of an odd numbered driver circuit and the output of an even numbered driver circuit. In fact the best technique is to combine both the gate clamp at the final and pre-driver stage. The circuit 56 shown in FIG. 3 operates using different time constants than the circuit 10 shown in FIG. 1. The time constant of the circuit 10 shown in FIG. 1 is small whereas the time constant of the circuit 56 shown in FIG. 3 is somewhat larger and depends on the dynamic powering up of the whole or parts of the integrated circuit, which will power up the gate clamps.

Figure 4:
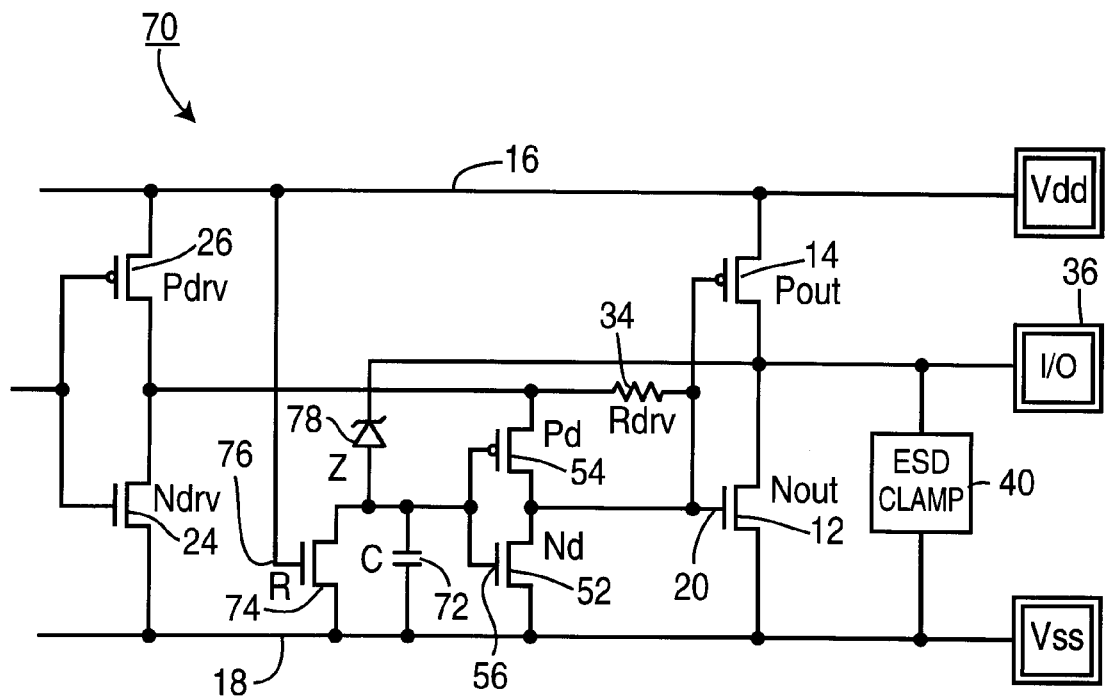
FIG. 4 is a circuit diagram of still another version of the circuit of the present invention.

Referring to FIG. 4, there is shown still another form of the circuit of the present invention, generally designated as 70. The circuit 70 is the same as the circuit 46 shown in FIG. 2 except for the construction of the trigger device. In the circuit 70, the resistor 50 of the RC circuit of the circuit 46 is replaced by a storage capacitor 72 and a leakage path in the form of a MOS transistor 74. The storage capacitor 72 is connected between the Vss line 18 and the gates of the inverter NMOS and PMOS transistors 52 and 54. The MOS transistor 74 is in parallel with the storage capacitor 72 with its gate 76 being connected to the Vdd line 16. The capacitor 48 of the RC circuit of the circuit 46 of FIG. 2 is replaced with a Zener diode 78 connected between the I/O pad 36 and the gates of the inverter NMOS and PMOS transistors 52 and 54. The Zener diode 78 provides capacitive coupling between the I/O pad 36 and the gate of the inverter NMOS transistor 52 as long as the Zener diode does not breakdown.

The circuit 70 operates in the same manner as the circuit 46 shown in FIG. 2. In the initial phase the trigger circuit of the circuit 70 operates in the same manner as the trigger circuit of the circuit 46 with the exception that some charge is now charged between the serial connected capacitor 72 and Zener diode 78. The leakage path provided by the MOS transistor 74 slowly discharges the capacitor 72 between the gate of the inverter NMOS transistor 52 and the Vss line 18. When the full EOS/ESD pulse hits the I/O pad 36, the voltage across the ESD clamp will eventually raise above the Zener breakdown voltage and the Zener diode 78 will conduct. This will charge-up the storage capacitor 72 between the gate of the inverter NMOS transistor 52 and the Vss line 18, which further ensures that the gate clamp is grounding the NMOS output driver gate. For alternating polarity pulses, like a typical Machine Model discharge pulse, the above described trigger circuit with the Zener 78, the storage capacitor 72 and the leakage path MOS transistor 74, with properly designed time constants, is a solution to ensure that the NMOS output drive remains off during subsequent negative and positive polarity changes.

Figure 5:
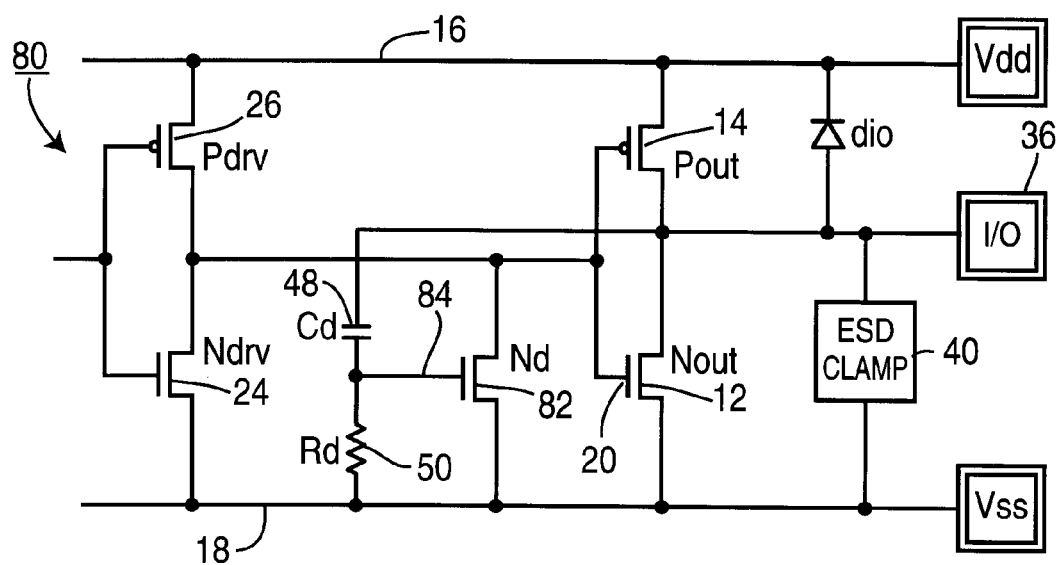
FIG. 5 is a circuit diagram of a further version of the circuit of the present invention.

Referring to FIG. 5, a fifth form of the circuit of the present invention is generally designated as 80. Circuit 80 is the same as the circuit 46 shown in FIG. 2 except that the inverter circuit (NMOS transistor 52 and PMOS transistor 54) is replaced by a single NMOS transistor 82. The gate 84 of the NMOS transistor 82 is controlled by the RC circuit. Alternatively, the RC circuit shown in FIG. 5 can be replaced by the Zener diode, capacitor and NMOS circuit shown in FIG. 4. In the circuit 80, under EOS/ESD conditions, the gate of the output drive NMOS transistor 12 is grounded by NMOS transistor 82, so that the output driver NMOS transistor 12 will be off.

Thus there is provided by the present invention circuits for protecting an output driver NMOS transistor during electrical overstress (EOS) and electrostatic stress (ESD). The circuits include means for turning off the output drive NMOS transistor during the stress. This is achieved by a clamp which is dynamically triggering during the EOS/ESD stress so as to ground the gate of the output driver NMOS transistor.

What is claimed is:
1. A circuit comprising:
 a first NMOS transistor having a first drain, a first gate, and a first source;
 a first PMOS transistor having a second drain, a second gate, and a second source, wherein said first drain is coupled to said second drain, and said first gate is coupled to said second gate;
 an I/O pad coupled to said second drain;
 a first ESD clamp coupled to said second drain;
 a first pre-driver circuit comprising a second NMOS transistor having a third drain, a third gate, and a third source and a second PMOS transistor having a fourth drain, a fourth gate, and a fourth source wherein said third drain is coupled to said fourth drain, wherein said second gate is coupled to said third drain; and
 a first gate clamp having a first terminal coupled to said first gate, a second terminal coupled to said third drain and a third terminal coupled to said ESD clamp.

2. The circuit of claim 1 further comprising:
a first resistor having a first terminal and a second terminal, wherein said first terminal of said first resistor is coupled to said second gate, wherein said second terminal of said first resistor is coupled to said third drain.

3. The circuit of claim 2 further comprising:
a second resistor having a first terminal and a second terminal, wherein said first terminal of said second resistor is coupled to said second drain and said second terminal of said second resistor is coupled to said I/O pad.

4. The circuit of claim 3 further comprising a dynamic trigger device having a first terminal and a second terminal, wherein said first terminal of said dynamic trigger device is coupled to said I/O pad, and said second terminal of said dynamic trigger device is coupled to said third terminal of said first gate clamp.

5. The circuit of claim 4 wherein said dynamic trigger device is a diode.

6. The circuit of claim 3 further comprising:
a second pre-driver stage circuit comprising a third NMOS transistor having a fifth drain, a fifth gate, and a fifth source and a third PMOS transistor having a sixth drain, a sixth gate, and a sixth source, wherein said fifth drain is coupled to said sixth drain and said fifth gate is coupled to said sixth gate, wherein said fourth gate is coupled to said fifth drain;
a third resistor having a first terminal and a second terminal, wherein said first terminal of said third resistor is coupled to said fifth gate; and
a third pre-driver stage circuit comprising a fourth NMOS transistor having a seventh drain, a seventh gate, and a seventh source and a fourth PMOS transistor having an eighth drain, an eighth gate, and an eighth source, wherein said seventh drain is coupled to said eighth drain and said second terminal of said third resistor is coupled to said seventh drain.

7. The circuit of claim 6 further comprising:
a second gate clamp having a first terminal, a second terminal, and a third terminal, wherein said first terminal of said second gate clamp is coupled to said fifth gate, wherein said second terminal of said second gate clamp is coupled to said second terminal of said third resistor, and said third terminal of said second gate clamp is coupled to said third terminal of said ESD clamp.

8. The circuit of claim 7 further comprising a dynamic trigger device having a first terminal and a second terminal, wherein said first terminal of said dynamic trigger device is coupled to said second terminal of said second resistor and said second terminal of said dynamic trigger device is coupled to said third terminal of said first gate clamp.

9. The circuit of claim 7 wherein said dynamic trigger device is a diode.

10. The circuit of claim 2 wherein said gate clamp circuit comprises:
a third NMOS having a fifth drain, a fifth gate, and a fifth source and a third PMOS transistor having a sixth drain, a sixth gate, and a sixth source, wherein said fifth drain is coupled to said sixth drain and said first gate, said sixth source is coupled to said second terminal of said first resistor, wherein said fifth gate is coupled to said sixth gate.

11. The circuit of claim 10 further comprising:
a capacitor having a first terminal and a second terminal, wherein said second terminal of said capacitor is coupled to said second drain; and
a second resistor having a first terminal coupled to said first terminal of said capacitor.

12. The circuit of claim 11 wherein said fifth gate is coupled to said first terminal of said capacitor.

13. The circuit of claim 12 wherein said second drain is for coupling to a Vdd line.

14. The circuit of claim 10 further comprising:
a MOS transistor having a terminal wherein said MOS transistor terminal is coupled to said fifth gate;
a capacitor having a terminal wherein said capacitor terminal is coupled to said fifth gate; and
a zener diode having a first terminal and a second terminal wherein said first terminal of said zener diode is coupled to said fifth gate, wherein said second terminal of said zener diode is coupled to said second drain.

15. The circuit of claim 1 further comprising a diode having a terminal wherein said diode terminal is coupled to said second drain.

16. The circuit of claim 15 wherein said gate clamp comprises a third NMOS transistor having a fifth drain and a fifth gate, wherein said fifth drain is coupled to said second gate.

17. The circuit of claim 16 further comprising:
a capacitor having a first terminal and a second terminal, wherein said second terminal of said capacitor is coupled to said second drain; and
a resistor having a terminal coupled to said first terminal of said capacitor, wherein said fifth gate of said third NMOS transistor is coupled to said first terminal of said capacitor.

18. The circuit according to claim 16 further comprising:
a fourth NMOS transistor having a sixth drain, wherein said sixth drain is coupled to said fifth gate;
a capacitor having a terminal, wherein said capacitor terminal is coupled to said fifth gate; and
a zener diode having a first terminal and a second terminal, wherein said first terminal of said zener diode is coupled to said fifth gate and said second terminal of said zener diode is coupled to said second drain.

* * * * *